United States Patent [19]

Harada et al.

[11] 3,801,880

[45] Apr. 2, 1974

[54] MULTILAYER INTERCONNECTED STRUCTURE FOR SEMICONDUCTOR INTEGRATED CIRCUIT AND PROCESS FOR MANUFACTURING THE SAME

[75] Inventors: Seiki Harada, Hachioji; Saburo Nonogaki, Meguro; Yoichi Oba, Hachioji; Atsushi Saiki, Tokyo; Takahiro Okabe; Takahiro Kohashi, both of Hachioji; Kikuji Sato, Hachioji, all of Japan

[73] Assignee: Hitachi, Ltd., Tokyo, Japan

[22] Filed: Sept. 11, 1972

[21] Appl. No.: 287,794

[30] Foreign Application Priority Data

Sept. 9, 1971 Japan ............................... 46-69215

[52] U.S. Cl...... 317/234 R, 317/234 M, 317/234 N, 29/576 R, 117/212

[51] Int. Cl. ............................................. H01l 5/02

[58] Field of Search...................... 317/234, 5.3, 5.4; 29/576 R; 117/212

[56] References Cited

UNITED STATES PATENTS

| | | | |
|---|---|---|---|
| 3,597,834 | 8/1971 | Lathrop | 29/576 |
| 3,700,508 | 10/1972 | Keen | 156/3 |
| 3,519,901 | 7/1970 | Bean et al. | 317/235 |
| 3,602,635 | 8/1971 | Romankiw | 174/68.5 |
| 3,622,384 | 11/1971 | Davey | 117/212 |

*Primary Examiner*—Rudolph V. Rolinec
*Assistant Examiner*—E. Wojciechowicz
*Attorney, Agent, or Firm*—Craig and Antonelli

[57] ABSTRACT

A multilayer interconnected structure is composed of a first patterned layer formed on a semiconductor substrate, through an $SiO_2$ film where necessary, lands, trapezoidal in cross section, which are formed on the first patterned layer to connect the latter to another patterned layer to be formed thereon, a thermosetting polymer layer applied on the first layer to a thickness up to the surface of the trapezoidal lands, and a second patterned layer spread over the resin layer and electrically connected to the trapezoidal lands. By this fabrication technique a multilayer interconnected structure is obtained which has a minimum of steps in its individual patterned layers and possesses desirable inter-layer insulation characteristics.

24 Claims, 28 Drawing Figures

MULTILAYER INTERCONNECTED STRUCTURE FOR SEMICONDUCTOR INTEGRATED CIRCUIT AND PROCESS FOR MANUFACTURING THE SAME

BACKGROUND OF THE INVENTION

This invention relates to a multilayer interconnected structure for semiconductor integrated circuitry and a method for manufacturing the same.

Conventional methods of fabricating multilayer interconnected structures for semiconductor integrated circuits, particularly for monolithic IC's, are generally as summarized, in the order of process steps, as follows:

1. The step of forming an insulation film of $SiO_2$ or the like in the usual manner, e.g., by chemical vapor deposition or RF sputtering, over a silicon substrate which already has an active element of a semiconductor device, such as a transistor, in the proximity of its surface;
2. The step of removing, by a known method such as photo-etching, the portions of the $SiO_2$ film that have to be removed for the connection between the substrate and a first patterned layer to be formed thereon;
3. The step of depositing by evaporation an electrically conductive metal, such as aluminum, over the entire exposed surfaces of the substrate and insulation film;
4. The step of etching the metallic film by the photoetching technique to a desired pattern so as to form a first pattern layer;
5. The step of forming an $SiO_2$ film over the entire exposed surfaces of the patterned layer and insulation film by repeating the sequence of the step 1 above;
6. The step of removing the portions of the $SiO_2$ film that have to be etched away for the connection between the first patterned layer and another layer to be formed thereon in accordance with the procedure of the step 2 above;
7. The step of forming a metallic film over the entire exposed surfaces in accordance with the step 3 above; and
8. The step of forming a second patterned layer by etching the metallic film in accordance with the step 4 above.

Thus, a double layer interconnected structure is obtained by a total of eight steps. Structures of three, four or more layers are made by repeating the aforedescribed steps, accordingly.

However, the multilayer interconnected structures manufactured in this way have some disadvantages. For example:

i. The steps which result from the thickness of the first patterned layer over the substrate or also from the through holes formed in the insulating film, for the connection between the first and second patterned layers, can adversely affect the second layer, causing the circuit to open along those steps.

ii. Pinholes tend to develop through the insulation film at the points of crossover between the first and second patterned layers and, therefore, the two layers are likely to be short circuited.

In an effort to settle the problems of steps in the multilayer structures, it has been proposed and practiced to deposit an aluminum film by evaporation over the entire surface of the backing sheet and then selectively convert the deposited layer except the portions required for interconnection with the other layer into an $Al_2O_3$ film is a poor insulator itself and is not useful for the insulation between the conductive patterned layers.

SUMMARY OF THE INVENTION

It is an object of this invention to provide a multilayer interconnected structure which is free of steps and exhibits satisfactory insulation characteristics, using lands of metal, trapezoidal in cross section, as interlayer connectors, and resin or glass as interlayer insulation.

Another object of the invention is to provide a process best suited to the manufacture of the aforementioned multilayer interconnected structure.

These objects of the present invention are realized by a process which, in essence, comprises either forming on a first patterned layer a metallic layer in the form of lands trapezoidal in cross section as connectors between the first layer and a second patterned layer to be formed thereon or forming such trapezoidal lands first and then depositing the first patterned layer in electrical connection with the lands, applying resin or glass over the entire surface excepting the upper ends of the trapezoidal metallic lands and curing or hardening the resin or glass layer, so that the thickness of the resulting layer may be substantially flush with the upper ends of the trapezoidal lands, and depositing a second patterned layer over the resin or glass layer in such a manner that at least a part of the second layer is in contact with the upper ends of the trapezoidal metallic lands. In this way, good interlayer insulation characteristics are ensured and the problems of steps due to the individual layer configurations can be solved.

DESCRIPTION OF PREFERRED EMBODIMENTS

Example 1

FIGS. 1*a*–1*f* give a series of diagrammatic sectional views showing how a triple-layer interconnected structure is fabricated in conformity with the instant invention.

Figure 1A:
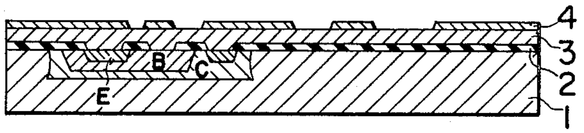
FIGS. 1*a*–1*f* diagrammatically illustrate the process for manufacturing a multilayer interconnected structure in accordance with this invention, with a series of sectional views showing a typical sequence of fabrication.
Figure 1B:
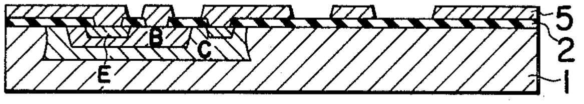

First, as shown in FIG. 1*a*, a silicon dioxide film 2 deposited over a silicon substrate 1 which is already formed with a semiconductor device, e.g., a transistor consisting of a collector region C, a base region B, and an emitter region E, by impurity diffusion in a known manner, is formed with through holes reaching all three regions C, B and E. A film 3 of an electrically conductive metal, e.g., aluminum, is deposited by evaporation over the silicon dioxide film 2, filling up the holes. Over this film is spread a photoresist film 4 in conformity with the desired pattern for the aluminum. The portions of the aluminum film 3 that are not covered by the photoresist film 4 are then etched away to leave a first patterned layer 5 of aluminum as shown in FIG. 1*b*.

Next, as in FIG. 1*c*, an aluminum film 6 is again deposited by evaporation over the entire surface, and a photoresist film 7 is left on the portions of the film 6 to be subsequently connected to a second patterned layer, and then the aluminum film 6 is subjected to etching and the photo-resist film 6 is removed. Thus, lands 8 trapezoidal in cross section are formed of the aluminum film 6.

In this case, it is, of course, possible to provide the trapezoidal metallic lands 8 in position before the first patterned layer 5 is formed.

Figure 1C:
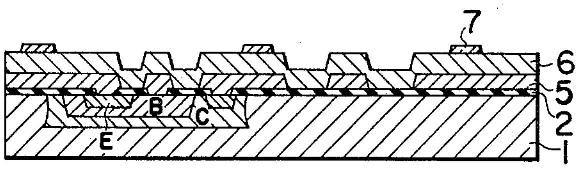
Figure 1D:
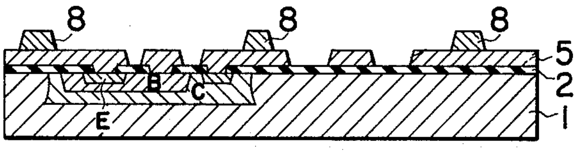
Figure 1E:
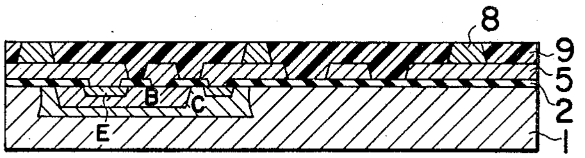

Thereafter, a prepolymer of thermosetting polymer resin, dissolved in a suitable solvent to an appropriate viscosity, is applied on the pattern aluminum layer 5 over the substrate 1 as indicated in FIG. 1*e*. The prepolymer may be a commercially available polyimide resin, for example the one sold under the trademark "Pyre-ML" by Du Pont a U.S. corporation, and the solvent may be N-methyl-2-pyrrolidone. The thickness of the coat should be adjusted so that the trapezoidal lands 8 of aluminum are slightly covered and, in the course of subsequent resin curing by heating, for example at about 200° C for about 20 to 40 minutes for the above-mentioned resin, the coat of the resin film 9 shrinks by the evaporation of the solvent or by the curing reaction of the resin itself to such an extent that the surface of the resin film 9 is substantially flush with the trapezoidal metallic lands 8. In this way a first patterned layer having a cross section such as shown in FIG. 1e is obtained. In order to form a second patterned layer thereover, it is only necessary to repeat the aluminum deposition by evaporation as shown in FIG. 1*a* and the subsequent steps on the first patterned layer shown in FIG. 1*e*.

In the steps described in connection with the sectional view of FIG. 1*e* wherein the resin film 9 is applied, a very thin resin film may sometimes be left on top of the trapezoidal lands 8 to be connected to the second patterned layer. When this happens, the resin film can be eliminated to expose the upper surface of the trapezoidal metallic lands 8 without sacrificing the conductivity of aluminum, by either dipping the structure in a chemical solution, such as concentrated sulfuric acid, pyrrolidone, or dimethyl sulfoxide, for a short period of time (e.g., between about 10 seconds and 3 minutes) or irradiation with a gas plasma atmosphere or ion implantation.

Additional treatment of the exposed surface of the trapezoidal metallic lands with phosphoric acid or the like will give a good result for the electrical contact with the overlying conductive layer.

Figure 1F:
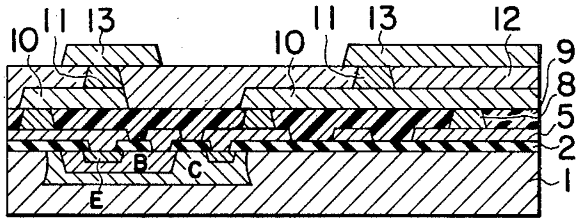

The sectional view of FIG. 1*f* shows that, by repeating the foregoing procedure, a second patterned layer 10, trapezoidal lands 11 for the connection of the second layer to a third layer, a thermosetting polymer resin layer 12, and a topmost layer or the third patterned layer 13 have been formed in the order mentioned.

It is, of course, possible to form a fourth patterned layer and so forth, if desired, over the third layer. If such is the case, it is only necessary to repeat the steps illustrated in FIG. 1*c* and the ensuing sectional views.

An attempt to use a thermoplastic fluoride resin (e.g., an ethylene tetrafluoride resin sold under the trademark "Teflon") as the polymeric insulation to package IC chips on patterned substrate to thereby provide interconnected structures of substantially two- or more patterned layers is discussed in an article by DENSHI ZAIRYO (Electronic Materials), Aug., 1970, p. 94. The method is applicable to the insulated substrate having great mechanical strength, but involves many difficulties in the application to a brittle semiconductor substrate such as silicon. This is because Teflon for such a purpose must be applied in the form of fine powder or thin film over the substrate and must be pressed against the latter with heat and a considerable pressure.

Further, if Teflon or a similar thermoplastic resin is employed in the process of the invention, in the heating stages for the formation of the second and subsequent resin films the Teflon or the like will melt together with the resin film or films already formed, thus making it extremely difficult to maintain the structure of interconnected layers fabricated beforehand. For these reasons thermoplastic resins are not adapted for use in accordance with this invention.

Example 2

Another embodiment of the present invention will now be described with reference specifically to FIGS. 2*a*–2*d*. As shown in the sectional view of FIG. 2*a*, a silicon substrate 21 is formed with a transistor device consisting of a collector region C, base region B, and an emitter region E, and also with other elements such as diode and resistor, and is coated with a silicon dioxide film 22 except for the portions from which electrodes are let out. A relatively thick aluminum layer 23 is deposited by evaporation over the silicon dioxide, and a photoresist film 24 is selectively left over the aluminum layer in accordance with a desired pattern.

Figure 2A:
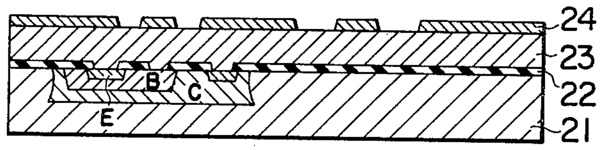
FIGS. 2*a* through 6*f* are similar diagrammatical sectional views showing other embodiments of the invention.
Figure 2B:
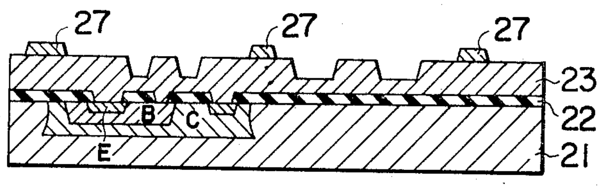
Figure 2C:
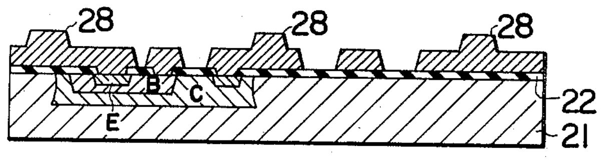

Next, as shown in FIG. 2*b*, the portions of the aluminum layer 23 not covered with the photoresist film 24 are etched to a depth equal to more than a half of the thickness of the layer. Thereafter, a photoresist film 27 is selectively left at points necessary for the connection with the second patterned layer and etching is again carried out. In this way, trapezoidal metallic lands 28 are formed for the connection with the second patterned layer as shown in FIG. 2*c*.

Figure 2D:
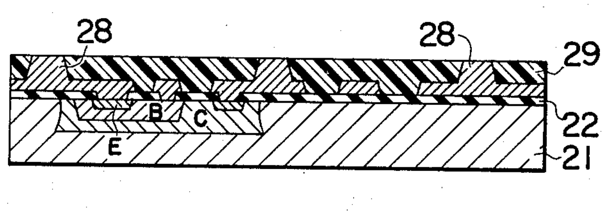

Lastly, as shown in FIG. 2*d*, a thermosetting resin layer 29 is formed in the same manner as described in Example 1. The procedure may, of course, be repeated to produce an interconnected structure of two or more patterned layers. Although the structure thus obtained is, after all, very similar to the one fabricated in accordance with Example 1, this procedure has an advantage that each patterned layer requires only one evaporation step.

While embodiments of the present invention using aluminum as the metallic material for the interconnection purpose have been described in Examples 1 and 2, other conductors, e.g., gold, molybdenum, chromium, nickel, platinum, or titanium, or an alloy of such metals, or a multiple layer consisting of two or more layers of such metals or alloys may be employed. Those metals and alloys are superior in mechanical strength to aluminum, and are particularly more stable than aluminum in the chemical and physical peeling treatment for exposing the upper surfaces of the trapezoidal metallic lands (e.g., the lands 8 of FIGS. 1*d*–1*f* and the lands 28 of FIGS. 2*c*–2*d*) for the connection with an overlying patterned layer.

In FIG. 1*c*, the conductive layer 6 may be made of a metal different from the one constituting the layer 5.

For example, the layer 5 is a sandwiched layer of molybdenum, gold, and molybdenum, while the layer 6 is made solely of aluminum.

The foregoing structure has the advantage in that the molybdenum-gold-molybdenum layer is not attacked by the etching solution for the aluminum and, therefore, the patterned layer remains inert to the etching for the formation of the trapezoidal metallic lands 8.

Example 3

Figure 3A:
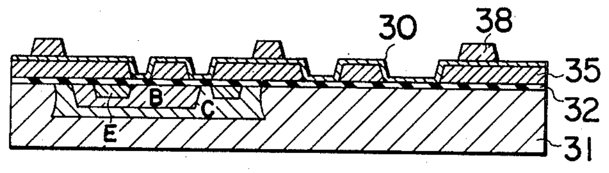

As an improvement of Example 1 for preventing the corrosion of the patterned layer underlying the trapezoidal metallic lands 8, the following method is now proposed. The general concept of the method is represented in FIGS. 3*a*–3*b*.

A film 32 of silicon dioxide having holes in desired portions is formed over a silicon substrate 31 which, in turn, is formed with built-in elements, such as a transistor, diode, and resistor, by the same steps as already described in conjunction with the sectional views of FIGS. 1*a* and 1*b*. A first patterned layer 35 of aluminum is deposited over the silicon dioxide film and, as shown in FIG. 3*a*, a very thin film 30 of another metal, e.g., molybdenum, chromium, nickel, or gold, which is slightly or not corroded by the etching solution for aluminum, is deposited over the first layer to a thickness ranging, for example from about 200 to 500 A by a known metal-coating method such as evaporation. Then, an aluminum layer is formed by evaporation for forming trapezoidal metallic lands 38, and the lands are shaped by photo-etching.

Figure 3B:
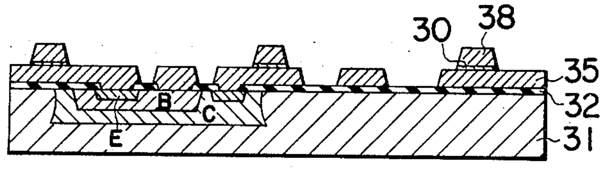

Following this, as shown in the sectional view of FIG. 3*b*, the portions of the metallic film 30 not covered by the trapezoidal lands 38 are removed by a treatment for a short period of time with a solution which does not corrode aluminum, for example a mixed iodine-ammonium iodide solution for a film 30 of gold. In this way, the trapezoidal lands 38 are left behind with practically no corrosion of the patterned layer 35.

Example 4

Figures 4A, 4B, 4C, 4D, 4E, 4F:
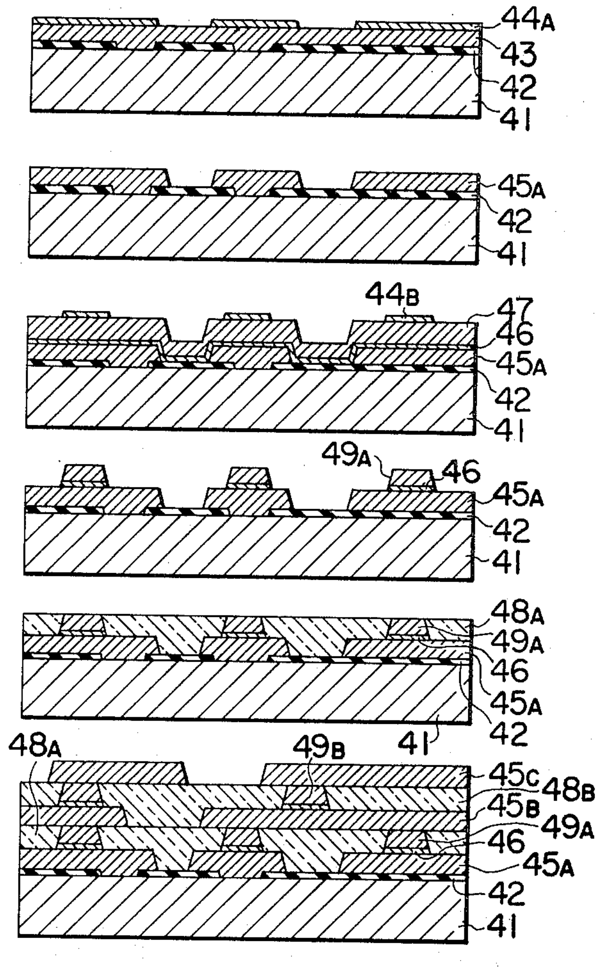
Figures 5A, 5B, 5C, 5D:
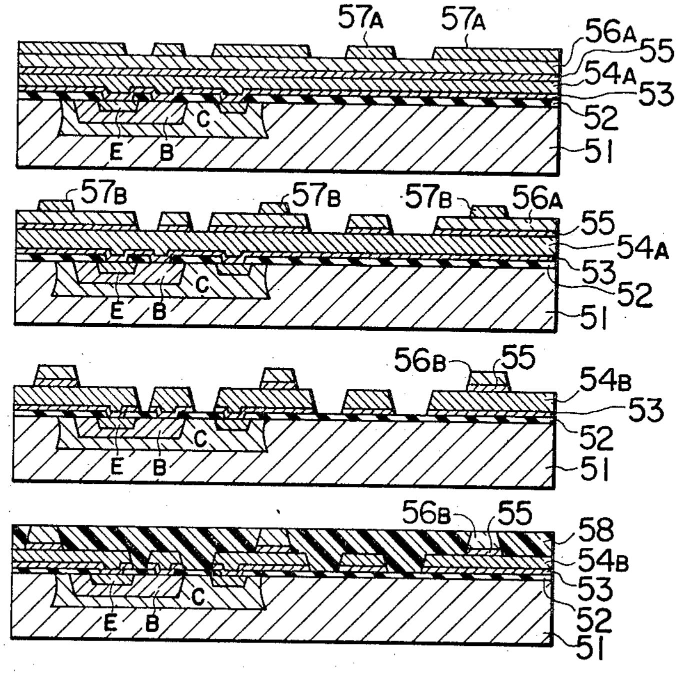

The sectional views of FIGS. 4*a*–4*f* illustrate an embodiment wherein the resin used in the preceding embodiments is replaced by a paste of glass powder mixed with a solvent to have a suitable viscosity. The product is a two-patterned-layer interconnected structure. First, as shown in FIG. 4*a*, a conductive metal 43, e.g., aluminum, is deposited by vacuum evaporation or other method over the entire surface of a silicon substrate 41 which has built-in semiconductor devices, e.g., a transistor and diode, and a silicon oxide film 42 formed immediately over the silicon substrate with through holes formed for the electrodes of the semiconductor elements. A photoresist film 44A is formed over the aluminum layer 43 in conformity with the pattern desired of the latter, and the aluminum portions not covered by the photoresist film are etched away, and then the photoresist is removed. In this manner, a patterned layer 45A of aluminum is formed as in FIG. 4*b*. Next, lands to serve as the connections between the first patterned layer and a second layer are formed. At this point, a film 46 of a metal which is not etched away by the etching solution for aluminum and possesses good electrical conductivity, e.g., gold, copper, nickel, molybdenum, or chromium, is deposited in the usual manner as by evaporation to a thickness of about 200 to 500 A over the entire surface of the substrate in the state shown in FIG. 4*b*. This metallic film is used to protect the patterned layer 45A when the lands for the interconnection purpose are to be formed. On the surface of the film 46 which has been formed over the substrate for above-explained reason, another layer of aluminum 47 is deposited by evaporation and, leaving photoresist 44B on the portions to be subsequently connected to the second patterned layer, as shown in FIG. 4*c*, etching is again performed. In this case, the etching of aluminum is stopped when it has proceeded down to the metallic film, so that the patterned layer 45A is protected. Thereafter, the metallic film 46 is removed by etching, and metallic lands 49A which are trapezoidal in cross section result. If, for example, gold is used to form the metallic film 46 in the stage just described, the gold will not be attacked by the etching solution for aluminum provided that the solution consists, for example, of phosphoric acid, nitric acid, glacial acetic acid, and water. Also, if a mixed solution of iodine, ammonium iodide, and alcohol is used for the removal of such a gold film which is about 500 A in thickness, the film will be etched away within about 10 to 20 seconds with almost no corrosive attack against aluminum.

Following the steps above described, glass powder having a low boiling point (400° – 700° C) mixed with a suitable solvent to a suitable viscosity is applied on the surface prepared as in FIG. 4*d*. The glass powder is commercially available, for example a composition sold under the trademark "Corning 1826" (composed chiefly of $SiO_2$ and $B_2O_3$ and containing $Al_2O_3$ and PbO) pulverized to a particle size of 0.1 to 0.05$\mu$ in diameter. The fine powder is mixed with a solution of nitrocellulose in amyl acetate to a paste form having an appropriate viscosity. The paste having a viscosity of about 30 to 80 centipoises is applied on the substrate surface by a rotor running at about 3,500 to 7,000 rpm, when a film having a thickness of about 0.5 to 3$\mu$ can be formed. The viscosity of the paste may be decreased, if desired, by adding methanol to the glass powder.

The thickness of the pasty coat is such that the trapezoidal metallic lands 49A of aluminum are slightly covered. Then, in order to avoid blackening or bubbling with the organic solvent, the coated structure is heated at about 350° to 400° C for about 5 to 10 minutes. In this way the solvent is evaporated off and the coated surface is oxidized. Next, the surface is heated at a proper temperature of not lower than about 400° C and cooled at a rate of about 10° to 25° C/min to form a vitreous film. The volume of the vitreous film is smaller than that of the original paste by approximately 5 to 15 percent (depending upon the viscosity of the paste). It is, therefore, important to adjust the thickness of the paste layer first applied so that the resulting vitreous film can attain the desired thickness. In the manner described, the first patterned layer having the cross sectional configurations shown in FIG. 4*e* is formed. The second layer can be fabricated by simply repeating the sequence starting with the aluminum deposition as in FIG. 4*a*.

When the vitreous film 48A has been formed as shown in the sectional view of FIG. 4*e*, there remains a very thin vitreous film on the upper surfaces of the trapezoidal metallic lands 49A for subsequent interconnection of the patterned layers. This film can be removed and the upper surfaces of the aluminum lands 49A can be exposed without any loss of the conductivity of aluminum, by dipping the structure in a glass-etching solution, such as a mixed solution of fluoric acid and ammonium fluoride, for a short period of time (e.g., for about 20 seconds to 3 minutes) or by etching with ion implantation. The sectional view of FIG. **4*f* indicates that the second patterned layer 45B has been formed by the repetition of the foregoing procedure, the metallic lands 49B for subsequent connection to a third patterned layer 45C have been provided, and the vitreous film 48B has been spread by again resorting to the technique above described, so that the third patterned layer 45C** has been obtained.

Although an embodiment using aluminum as the metallic material to be patterned has been described in Example 4, it is to be understood that other metals, e.g., gold, copper, nickel, molybdenum, chromium, platinum, or titanium, or an alloy of two or more of such metals, or a multilayer conductor of two or more such metal or alloy layers may be used as well. They have a common advantage of greater mechanical strength than aluminum.

In the stage of FIG. **4*c* the patterned layer 47 may be made of a metal dissimilar to that which constitutes the patterned layer 45A. In other words, different metals are used for the patterned layers and the trapezoidal metallic lands which serve as interlayer connectors. For example, the patterned layer 45A may consist of a sandwiched layer of molybdenum-gold-molybdenum, whereas the patterned layer 47 is solidly made of aluminum. Because molybdenum is inert to the etching solution for aluminum, the patterned layer 45A is advantageously stable with respect to the etching solution that is used to form the metallic lands 49A trapezoidal in cross section. In this case the protective film 46** against etching may naturally be omitted.

Example 5

The present invention may be embodied in a structure which uses as the patterning materials multiple films consisting of a combination of metals other than aluminum. In this example a combination of molybdenum and gold will be described in detail.

As shown in the sectional view of FIG. **5*a*, a molybdenum film 53 about 1,000 A in thickness is deposited by sputtering or other method over a silicon dioxide film 52 which covers a substrate 51 having built-in devices such as a transistor element consisting of a collector region C, a base region B, and an emitter region E, and also diode and resistor, with the exception of the substrate surface portions through which electrodes are to be led out. The molybdenum film 53** has dual purposes of avoiding the effect of the gold film to be subsequently formed thereon upon the silicon elements (i.e., the diffusion of gold into silicon) and improving the adhesion of the film to silicon dioxide.

The gold film 54A to serve as the first patterned layer is deposited as by evaporation. It is followed by the deposition of an approximately 500 A-thick molybdenum film 55 (which serves as a stopper to the etching of the gold film thereover), and then by a gold film 56A to form trapezoidal metallic lands for the connection to the second patterned layer. After the multiple film layer has been formed in this way, a photoresist film 57A is selectively left on the multiple film layer in accordance with a desired pattern.

Using a mixed solution of iodine and ammonium iodide, for example, as an etching solution for gold, the gold portions not coated by the photoresist film 57A are removed and the uncoated molybdenum portions are etched away by a mixture of phosphoric acid and nitric acid, as shown in FIG. **5*b*. At this time, the gold film 54A** is left in tact because it is inert to the latter etching solution.

Again, a photoresist film 57B is selectively left on the portions necessary for the subsequent connection with the second patterned layer, and the gold films 56A, 54A and the molybdenum films 55, 53 are etched according to a desired pattern. Thus, as shown in FIG. **5*c*, metallic lands 56B trapezoidal in cross section (and based on the molybdenum film 55) can be formed for the connection between the first patterned layer 54B (overlying the molybdenum film 53**) and the second patterned layer.

Next, as shown in FIG. **5*d*, a thermosetting resin layer 58** is formed as the topmost layer in the manner described in Example 2.

Structures with more than two such patterned layers may of course be fabricated by repeating the procedure above described.

The multiple molybdenum-gold film structure obtained in this example has the advantage of better accuracy in the pattern and the formation of trapezoidal lands for the interconnection purpose than with the structure of Example 2.

While molybdenum and gold are used as the conductive materials in Example 5, it is also possible to manufacture a multilayer interconnected structure of the invention using either chromium, silver, nickel, platinum, or titanium, or an alloy of such metals, or a conductor of multiple structure consisting of two or more layers of such a metal or alloy.

Example 6

In the preceding examples, the process of the present invention has been described as embodied in the fabrication of multilayer interconnected structures by first forming each patterned layer and then forming trapezoidal metallic lands as connectors between the existing layer and another layer to be formed thereon. In this example it will be shown that the sequence can be reversed for the manufacture of the same multilayer interconnected structures.

Now the steps of first forming trapezoidal metallic lands and then each patterned layer will be described.

FIGS. **6*a*–6*f*** are diagrammatical sectional views for the fabrication of a three-layer patterned structure in accordance with our invention.

As specially shown in FIG. **6*a*, a desired thickness (about 1 to 5$\mu$) of an aluminum layer 63 is deposited by vacuum evaporation or otherwise over a silicon dioxide film 62 which in turn covers, with the exception of the portions through which electrodes are to be led out, the entire surface of a silicon substrate 61 having a transistor element 60 consisting of a collector region C, a base region B, and an emitter region E, and other devices such as diode and resistor. Over the aluminum layer 63 is selectively left a photoresist film 64** in conformity with a conductive-layer pattern for interlayer connection.

Next, as shown in FIG. **6*b*, the portions of the aluminum layer 63 not covered by the photoresist film 64 are removed with the use of an etching solution, thus leaving a conductive layer 65 for connection use, and the photoresist film on the layer 65 is removed. Then, over the half-treated surface of the substrate, an aluminum layer 66** is deposited to a thickness (about 0.5 – 1$\mu$) in the usual manner such as vacuum evaporation and, as shown in FIG. *6c*, a photoresist film 67 conforming to the pattern of a first conductive layer to be formed is formed over the layer 66. Thereafter, the aluminum portions other than those covered by the photorest film 67 are etched away, and the photoresist film 67 itself is removed, so that a first patterned layer 68 is formed as shown in FIG. *6d.*

Then, a prepolymer of a thermosetting polymer resin is dissolved in a suitable solvent to an adequate viscosity, and the solution is applied on the aluminum patterned layer over the substrate 61 as shown in FIG. *6e.* The prepolymer is a commercially available polyimide resin, for example "Pyre-ML," a product of Du Pont of the U.S., Toyo Rayon's "Torayneath," or Hitachi Chemical's "HI480." The solvent is, for example, N-methyl-2-pyrrolidone. The thickness of the coat is so adjusted that the surface of the first patterned layer 68 is slightly covered and by subsequent heating, for example, in the course of curing one of the above-mentioned resins at about 200° C for 20 to 40 minutes, the initial film thickness is reduced by the evaporation of the solvent or the curing reaction of the resin to such an extent that the surface of the resin film 69 becomes flush with that of the first patterned layer 68 already existent over the conductive layer 65 for the connection use.

In the stage of FIG. *6e*, the resin film thinly covering the conductive layer for the connection purpose can be removed by etching (for about 10 seconds to 3 minutes) with a chemical, such as concentrated sulfuric acid, pyrrolidone, or dimethyl sulfoxide, or by a surface treatment with a gas plasma atmosphere or by ion implantation.

Figure 6A:
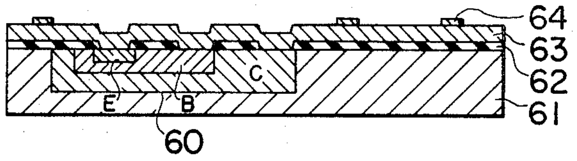
Figure 6B:
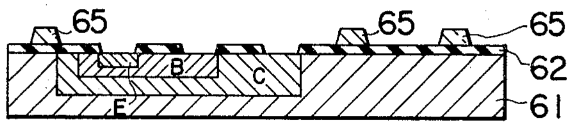
Figure 6C:
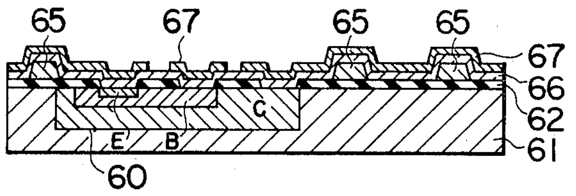
Figure 6D:
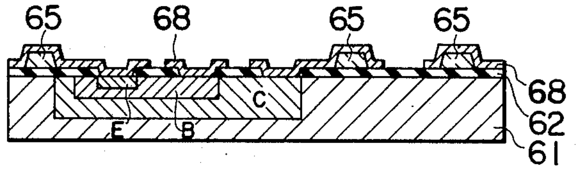
Figure 6E:
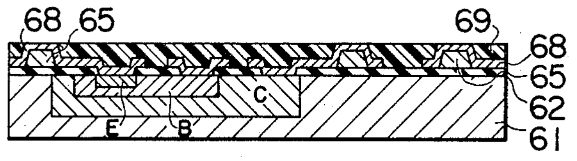
Figure 6F:
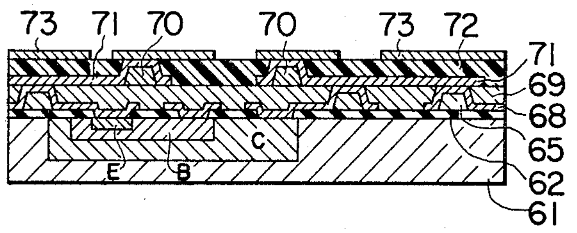

When a second patterned layer is to be formed over the first layer, the sequence of aluminum deposition in FIG. 6a and the following steps has only to be repeated.

The sectional view of FIG. *6f* shows that, by the repetition of the afore-described procedure, a conductive layer 70 for interlayer connection and a second patterned layer 71 have been formed, a thermosetting polymer resin layer 72 has been spread thereover, and a third patterned layer 73 has been formed as the topmost layer. It is, of course, possible to form the fourth and further patterned layers, in which case it is only necessary to repeat the steps of FIGS. 6a-6e for the formation of the conductive layer 13.

It should be noted that the thermosetting resin to be used in the practice of the present invention is not limited to the polyimide resins mentioned in the fogegoing examples, but other resins of epoxy, phenol, polycarbonate, polyamide, imide, and polybenzimidazole types may be used, either singly or in combination. In short, any resin having properties adapted for the practice of the invention may be used. The resin is required to remain unhardened at ordinary temperatures, and be adjustable with a solvent to a viscosity between about 100 and 500 centipoises, and fully cured and stabilized by heating at about 150° to 300° C for about several 10 minutes to several hours. The cured resin film must have a dielectric strength of not less than about $10^5$ V/cm and a thermal resistance such that it remains stable for many hours while being heated at about 200° C or upwards. In order to improve these properties, the thermosetting resin may contain pulverized addition agents, such as alumina and silica, before the formation of the resin film.

It should also be appreciated that the glass useful for the present invention is not limited to the "Corning 1826" mentioned in the examples, but other products of the same manufacturer, e.g., "Corning 7050, 7052 (mainly composed of $SiO_2$ and $B_2O_3$), 7570 (mainly composed of PbO, $SiO_2$ and $B_2O_3$), and 7720 (mainly composed of $SiO_2$ and $B_2O_3$)," may be employed as well in the form of a mixture with a nitrocellulose or amyl acetate solution with a suitable viscosity. Further, a solution of alkoxysilane in alcohol adjusted to a suitable viscosity and applied, and baked at about 150° to 400° C to a vitrified state may be used. In any case, the glass has only to possess the properties adapted for the practice of the present invention. For example, it should be adjustable to a suitable viscosity with a solvent at ordinary temperature; its treating temperature for vitrification should be lower than the melting point of the metal to be used and should not affect in any way the junction and diffused layer of the particular semiconductor device; and the vitreous film thereby formed should be physically and chemically stable with good adhesion to metallic materials and with a minimum of mobility of the ions contained.

Further, it is to be understood that the interconnected structures and the process of making the same which have thus far been described in Examples 1 through 6 are not confined to the fabrication of monolithic semiconductor devices, but the present invention is equally applicable to the manufacture of the hybrid semiconductor devices, the semiconductor devices using MOS type elements, the micro-semiconductor devices which require multilayer interconnected patterns, and the thin film integrated circuits of multilayer interconnected construction fabricated on dielectric substrates, etc.

What we claim is:

1. A multilayer interconnected structure comprising:

a semiconductor substrate;

a first conductive layer formed with a first prescribed pattern over a major surface of said substrate, said layer consisting of an integral layer of conductive material which includes at least one trapezoidally-shaped land portion extending from a first upper surface portion of said layer to a second upper surface of said layer spaced apart from said substrate by a greater distance from said first upper surface portion; and a first dielectric layer covering said major surface of said substrates and having embedded therein said first conductive layer in a manner to be substantially flush with the upper surface of said at least one trapezoidally shaped land portion.

2. A multilayer interconnected structure comprising:

a semiconductor substrate;

a first layer of insulating material selectively disposed on a major surface of said substrate while exposing predetermined surface areas of said major surface through apertures therein;

a first conductive layer formed with a first prescribed pattern over selected portions of the surface of said first layer of insulating material, said first conductive layer including spaced apart trapezoidally shaped land portions disposed directly on said first layer insulating of insulating material;

a second conductive layer formed with a second prescribed pattern over prescribed portions of the surface of said first layer of insulating material, extending through said aperture and contacting said major surface of said substrate and being disposed on said tranezoidally-shaped land portions of said first conductive layer so as to extend onto the upper surfaces thereof; and a second layer of insulating material consisting of a dielectric layer covering said first layer of insulating material and having embedded therein said first and second conductive layers in a manner to be substantially flush with the upper surface of the portions of said second conductive layer on the upper surfaces of said trapezoidally shaped land portions of said first conductive layer.

3. A multilayer interconnected structure according to claim 2, wherein said first conductive layer is aluminum.

4. A multilayer interconnected structure according to claim 3, wherein said second conductive layer is aluminum.

5. A multilayer interconnected structure according to claim 1, wherein said dielectric layer consists of a thermosetting polymer resin selected from the group consisting of epoxy resin, phenol resin, polycarbonate resin, polyamide resin, and polybenzimidazole resin.

6. A multilayer interconnected structure according to claim 2, wherein said dielectric layer consists of a thermosetting polymer resin selected from the group consisting of epoxy resin, phenol resin, polycarbonate resin, polyamide resin, and polybenzimidazole resin.

7. A multilayer interconnected structure according to claim 1, wherein the substrate is a semiconductor plate formed with a plurality of circuit elements, such as a transistor and a diode, in the surface portion, and the first conductive layer is partly connected electrically to the electrodes of the circuit elements, so that suitable electrical circuits are formed among the circuit elements.

8. A multilayer interconnected structure according to claim 1, wherein the first conductive layer is formed of a metal selected from the group consisting of aluminum, gold, molybdenum, chromium, nickel, platinum, and titanium.

9. A multilayer interconnected structure according to claim 1, wherein the first conductive layer is formed of an alloy made of a combination of two or more metals selected from the group consisting of aluminum, gold, molybdenum, chromium, nickel, platinum, and titanium.

10. A multilayer interconnected structure according to claim 1, further comprising a second conductive layer, formed with a second prescribed pattern on said first dielectric layer and contacting at least one selected one of said at least one trapezoidally shaped land portion.

11. A multilayer interconnected structure according to claim 2, wherein said substrate is a semiconductor plate formed with a plurality of circuit elements in the surface portion thereof and said first conductive layer is at least partially connected electrically to said circuit elements.

12. A process for manufacturing a multilayer interconnected structure for a semiconductor integrated circuit comprising the steps of:

a. forming a first patterned conductive layer with a desired pattern over a substrate surface;

b. coating the first patterned conductive layer with a metallic conductive layer and then selectively removing the latter layer thereby forming metallic lands, trapezoidal in cross section, of said metallic layer at desired points over the first patterned layer;

c. forming a dielectric layer around the trapezoidal metallic lands to a height substantially flush with the upper ends of said lands;

d. removing the dielectric film so formed in step c so as to thinly cover the upper portions of said trapezoidal metallic lands, and e. forming a second patterned conductive layer with a desired pattern in electrical contact with the upper portions of the trapezoidal metallic lands and spread over the dielectric layer.

13. A process according to claim 12, wherein the first patterned conductive layer is so formed that, after the trapezoidal metallic lands have been formed over the substrate surface, the first layer is in electrical contact with said metallic lands.

14. A process according to claim 12, wherein the dielectric consists of a thermosetting polymer resin.

15. A process according to claim 12, wherein the dielectric consists of a vitreous film.

16. A process according to claim 12, wherein steps a and b have an intermediate step of forming a film of a metal selected from the group consisting of molybdenum, chromium, nickel, copper, and gold, over the first patterned conductive layer.

17. A method according to claim 12, wherein the conductor to be patterned is a metal selected from the group consisting of aluminum, gold, molybdenum, chromium, nickel, platinum, and titanium.

18. A process according to claim 12, wherein the conductor to be patterned is an alloy combining two or more metals selected from the group consisting of aluminum, gold, molybdenum, chromium, nickel, platinum, and titanium, or a multiple film consisting of two or more layers of such an alloy or alloys.

19. A process according to claim 12, wherein the metal or alloy forming the conductor to be patterned is dissimilar to the one constituting the trapezoidal metallic lands.

20. A process for manufacturing a multilayer interconnected structure for a semiconductor integrated circuit comprising the steps of:

a. coating a substrate surface with a metallic conductive layer and then removing the portions of the metallic conductive layer other than the portions of a desired pattern selectively to a predetermined depth which is less then the thickness of the coated metallic conductive layer;

b. selectively removing said conductive layer in certain portions to a sufficient depth to permit insulation of said conductive layer, thereby forming trapezoidal lands of said metallic conductor in certain portions of said conductive layer and also forming a first patterned conductive layer;

c. forming a dielectric layer around the trapezoidal metallic lands to a height substantially flush with the upper ends of said lands;

d. removing the dielectric film so formed in step c so as to thinly cover the upper portions of said trapezoidal metallic lands, and e. forming a second patterned conductive layer with a desired pattern in electrical contact with the upper portions of the trapezoidal metallic lands and spread over the dielectric layer.

21. A process for manufacturing a multilayer interconnected structure for a semiconductor integrated circuit comprising the steps of:

a. coating a substrate surface with a metallic conductive layer and then selectively removing said conductive layer to a predetermined depth, thereby forming trapezoidal metallic lands of said metallic conductor in certain portions of said conductive layer;

b. further selectively removing said conductive layer to a desired depth, thereby forming a first conductive layer with a desired pattern in certain portions of said conductive layer;

c. forming a dielectric layer around the trapezoidal metallic lands to a height substantially flush with the upper ends of said lands;

d. removing the dielectric film so formed in step c so as to thinly cover the upper portions of said trapezoidal metallic lands, and e. forming a second patterned conductive layer with a desired pattern in electrical contact with the upper portions of the trapezoidal metallic lands and spread over the dielectric layer.

22. A process for manufacturing a multilayer interconnected structure for a semiconductor integrated circuit comprising the steps of:

a. forming an insulating layer on a substrate surface;

b. removing predetermined portions of the insulating layer so as to expose predetermined portions of the substrate surface;

c. coating a metallic conductive layer on the insulating layer and the exposed portions of the substrate surface;

d. removing the metallic conductive layer so as to form metallic lands, trapezoidal in cross section, of the metallic layer at desired points on the insulating layer;

e. coating a first patterned conductive layer with a desired pattern over the substrate surface, the insulating layer and the trapezoidal metallic lands;

f. forming a dielectric layer consisting of a thermosetting polymer resin around the trapezoidal metallic lands to a height substantially flush with the upper ends of said lands:

g. removing the dielectric film so formed in step f as to thinly cover the upper portion of said trapezoidal metallic lands; and h. forming a second patterned conductive layer with a predetermined pattern in electrical contact with the upper portions of the trapezoidal metallic lands and spread over the dielectric layer.

23. A multilayer interconnected structure according to claim 1, wherein said dielectric layer consists of polyimide resin.

24. A multilayer interconnected structure according to claim 2, wherein said dielectric layer consists of polyimide resin.

* * * * *